United States Patent
Hatakeyama et al.

(10) Patent No.: US 6,878,501 B2
(45) Date of Patent: Apr. 12, 2005

(54) POLYMER, CHEMICALLY AMPLIFIED RESIST COMPOSITION AND PATTERNING PROCESS

(75) Inventors: Jun Hatakeyama, Niigata-ken (JP); Jun Watanabe, Niigata-ken (JP); Yuji Harada, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 223 days.

(21) Appl. No.: 09/842,114

(22) Filed: Apr. 26, 2001

(65) Prior Publication Data

US 2002/0004569 A1 Jan. 10, 2002

(30) Foreign Application Priority Data

Apr. 27, 2000 (JP) .................................... 2000-127513

(51) Int. Cl.$^7$ ..................... G03F 7/004; C08F 214/18; C08F 10/00
(52) U.S. Cl. .................... 430/270.1; 430/326; 430/905; 526/242; 526/281; 526/262; 526/308; 526/319; 526/331; 526/313
(58) Field of Search ................ 430/270.1, 326, 430/905; 526/281, 242, 308, 319, 331, 313, 262

(56) References Cited

U.S. PATENT DOCUMENTS

| | | |
|---|---|---|
| 4,491,628 A | 1/1985 | Ito et al. |
| 5,576,143 A | 11/1996 | Aoai et al. |
| 5,580,695 A | 12/1996 | Murata et al. |
| 5,843,624 A | 12/1998 | Houlihan et al. |
| 5,968,712 A | 10/1999 | Thackeray et al. |
| 5,968,713 A | 10/1999 | Nozoki et al. |
| 5,998,099 A | 12/1999 | Houlihan et al. |
| 6,013,416 A | 1/2000 | Nozoki et al. |
| 6,136,501 A | * 10/2000 | Trefonas, III et al. ... 430/270.1 |
| 6,468,712 B1 | * 10/2002 | Fedynyshyn ............. 430/270.1 |
| 6,503,686 B1 | * 1/2003 | Fryd et al. ............... 430/270.1 |
| 2002/0146638 A1 | * 10/2002 | Ito et al. .................. 430/270.1 |
| 2002/0197555 A1 | * 12/2002 | Rahman et al. .......... 430/270.1 |

FOREIGN PATENT DOCUMENTS

| | | |
|---|---|---|
| JP | 63-27829 | 2/1988 |
| JP | 2-27660 | 6/1990 |
| JP | 9-73173 | 3/1997 |
| JP | 9-230595 | 9/1997 |
| JP | 10-10739 | 1/1998 |
| WO | wo 97/33198 | 12/1997 |

OTHER PUBLICATIONS

J. Photopolymer Sci. and Technol., vol. 5, No. 3 (1992), pp. 439–445.
J. Electrochem. Soc.: Solid–state Sci. and Technol., vol. 130, No. 1, Jan. 1983, pp. 143–146.
SPIE, vol. 2724, pp. 365–377 (1996).
SPIE, vol. 3678, pp. 1209–1214 (1999).
English Abstract JP 5–232706 (corresponds to US 5580695).
English Abstract JP 5–249683.
English Abstract JP 5–158239 (corresponding to US 5,576,143).
English Abstract JP 5–249662 (corresponding to US 5,968,712).
English Abstract JP 5–257282.
English Abstract JP 5–289340 (Corresponding to US 5,580,695).

* cited by examiner

Primary Examiner—Rosemary Ashton
(74) Attorney, Agent, or Firm—Millen, White, Zelano & Branigan, P.C.

(57) ABSTRACT

Polymers comprising recurring units of cycloolefin having fluorinated alkyl introduced therein are novel and have transparency and alkali solubility. Using the polymers, resist compositions featuring low absorption of $F_2$ excimer laser light are obtained.

29 Claims, No Drawings

POLYMER, CHEMICALLY AMPLIFIED RESIST COMPOSITION AND PATTERNING PROCESS

This invention relates to a chemically amplified resist composition suited for micropatterning technology. More particularly, it relates to a polymer useful as a base polymer in such resist compositions, a chemically amplified resist composition comprising the same, and a patterning process using the resist composition.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF laser (193 nm) is expected to enable miniaturization of the design rule to 0.13 $\mu$m or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ excimer laser (157 nm) which is expected to enable further miniaturization to 0.10 $\mu$m or less, more difficulty arises in insuring transparency because it was found that acrylic resins are not transmissive to light at all and those cycloolefin resins having carbonyl bonds have strong absorption. It was also found that polyvinylphenol is somewhat improved in transmittance in proximity to 160 nm, but far below the practical level, and reducing carbonyl and carbon-to-carbon double bonds is essential for insuring a transmittance. However, cyclic structures and carbon-to-carbon double bonds greatly contribute to an improvement in dry etching resistance. A polymer for use with an ArF excimer laser, in which a benzene ring is excluded and instead, an alicyclic structure is introduced for improving etching resistance, is difficult to provide transparency since it acquires solubility by relying on carboxylic acid.

The use of a fluorine-substituted polymer was found effective as a means for improving transparency. Making a study to improve the transparency of an acrylic polymer used in ArF resist compositions, the inventor proposed the use of an acrylic derivative having a fluorine-substituted backbone.

In most cases, dry etching resistance is conventionally discussed in conjunction with the selection ratio of etching. As described in many reports, for example, J. Photopolymer Sci. and Technol., Vol. 5, No. 3 (1992), p. 439, J. Electrochem. Soc.: Solid-State Sci. and Technol., Vol. 130, No. 1, January 1983, p. 143, and SPIE, Vol. 2724, p. 365 (1996), engineers attempted to express the dry etching selection ratio of a single layer resist using various parameters. Typical are Onishi parameter and ring parameter.

It was recently reported in SPIE, Vol. 3678, p. 1209 (1999) that micro-roughness develops on the resist surface after dry etching and is transferred after substrate processing and resist removal. Making extensive studies, the inventor found that the development of roughness after etching occurs when dry etching of $SiO_2$ is carried out with a fluorocarbon gas such as $CF_4$, $CHF_3$, $C_2F_6$, $C_3F_8$ or $C_4F_{10}$ and that roughness increases under the high throughput conditions where the RF power is increased for high etching selection ratio, that is, fast etching of oxide film. It was further found that roughness largely differs depending on the type of polymer used in ArF single layer resist. A noticeable roughness develops with acrylic polymers. In contrast, roughness declines with cycloolefin polymers such as norbornene homopolymers and alternating copolymers of norbornene with maleic anhydride. In particular, norbornene homopolymers give small values of roughness even compared with polyhydroxystyrene for KrF. Herein, acrylic polymers with pendant adamantane exhibit a satisfactory value of etching speed, that is, selection ratio, fully comparable to cycloolefin polymers. When high selectivity etching was effected in an etching speed ratio of at least 3 between oxide film and resist, the surface roughness Rms of the etched surface as measured by atomic force microscopy (AFM) was more than 15 nm for acrylic polymers and less than 3 nm for cycloolefin polymers. These results indicate that the selection ratio of etching does not necessarily coincide with the roughness after etching.

It is pointed out that what becomes a problem as a result of wavelength reduction is a lowering of transparency, and in the case of a positive resist material, a negative working phenomenon that the exposed areas become insoluble as the dose of exposure is increased. Those portions which have turned negative are insoluble not only in alkali developers, but also in organic solvents such as acetone. This indicates that gel forms as a result of crosslinking of molecules together. Radical generation is probably one cause of crosslinking. As a result of wavelength reduction, the exposure energy is increased so that even C—C bonds and C—H bonds may be excited in the case of $F_2$ exposure (157 nm). As a result of excitation, radicals are generated with a possibility that molecules are bonded together. For polymers having an alicyclic structure for use in ArF exposure, for example, polynorbornene, an outstanding negative working phenomenon was observed. It is believed that these polymers have a structure susceptible to crosslinking since the alicyclic group has many C—H bonds at the bridgehead. On the other hand, it is well known that $\alpha$-methylstyrene and derivatives thereof are effective for preventing crosslinking. Alpha-methylstyrene can mitigate the negative working phenomenon, but fail to completely eliminate the phenomenon. Moreover, since oxygen absorption is considerable in the VUV region, exposure is effected under the conditions that oxygen is purged, with an inert gas such as nitrogen or argon, to an oxygen concentration of 1 ppm or lower. Since oxygen is an effective radical trapping agent, this means that the radicals generated have a long lifetime and more crosslinking takes place.

SUMMARY OF THE INVENTION

An object of the invention is to provide a novel polymer useful as the base polymer in resist compositions, a chemical amplification resist composition comprising the polymer, and a patterning process using the same, which polymer or resist composition has a high transmittance to vacuum ultraviolet radiation of up to 300 nm, especially an $F_2$ excimer laser beam (157 nm), $Kr_2$ excimer laser beam (146 nm), KrAr excimer laser beam (134 nm) and $Ar_2$ excimer laser beam (126 nm), as well as improved negative conversion-preventing effect and dry etching resistance.

The inventor has found that using a cycloolefin polymer having fluorinated alkyl groups as the base polymer, a resist composition featuring transparency, negative-conversion preventing effect, and dry etching resistance is obtained.

In one aspect, the invention provides a polymer comprising recurring units of the following general formula (1)

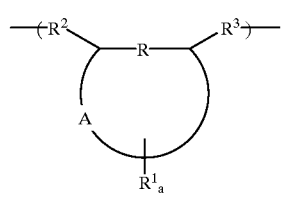

(1)

Herein A is a divalent aliphatic or alicyclic hydrocarbon group of 2 to 20 carbon atoms, $R^1$ is an alkyl group containing at least one fluorine atom, which may contain a hetero atom such as oxygen, nitrogen or sulfur to form an ether, ester, carbonate, alcohol, acetoxy or thioester, "a" is a positive number of 1 to 3, R is a single bond, methylene group, oxygen atom, NH group or sulfur atom, and $R^2$ and $R^3$ each are a single bond or methylene group.

The polymer may further comprise recurring units containing acid labile groups.

In another aspect, the invention provides a chemically amplified resist composition comprising the polymer defined above, and specifically, a chemically amplified positive resist composition comprising (A) the polymer defined above, (B) an organic solvent, and (C) a photoacid generator. In preferred embodiments, the resist composition further includes a basic compound and/or a dissolution inhibitor.

In a further aspect, the invention provides a process for forming a resist pattern comprising the steps of applying the resist composition defined above onto a substrate to form a coating; heat treating the coating and then exposing it to high-energy radiation having a wavelength of up to 180 nm or electron beams through a photo mask; and optionally heat treating the exposed coating and developing it with a developer.

DESCRIPTION OF THE PREFERRED EMBODIMENT

Polymer

According to the invention, the polymer or high molecular weight compound is defined as comprising recurring units of the following general formula (1).

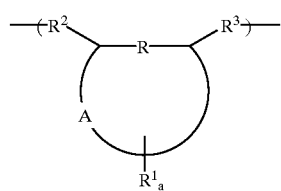

(1)

Herein A is a divalent aliphatic or alicyclic hydrocarbon group of 2 to 20 carbon atoms, $R^1$ is an alkyl group containing at least one fluorine atom, which may contain a hetero atom such as oxygen, nitrogen or sulfur to form an ether, ester, carbonate, alcohol, acetoxy or thioester, "a" is a positive number of 1 to 3, R is a single bond, methylene group, oxygen atom, NH group or sulfur atom, and $R^2$ and $R^3$ each are a single bond or methylene group.

Preferred among the polymers of formula (1) are those polymers of the following formulas (2)-1 to (2)-9.

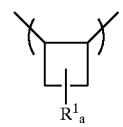

(2)-1

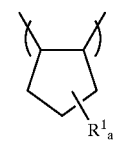

(2)-2

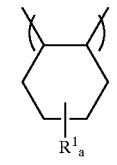

(2)-3

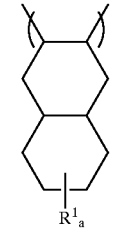

(2)-4

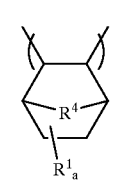

(2)-5

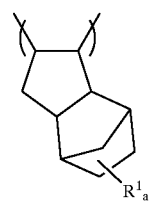

(2)-6

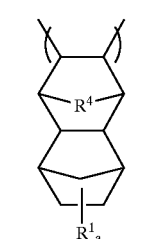

(2)-7

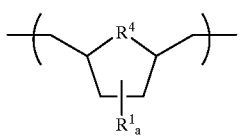 (2)-8

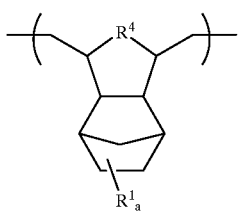 (2)-9

Herein $R^4$ is a methylene group, oxygen atom, NH group or sulfur atom.

Examples of the fluorine-containing substituents represented by $R^1$ include those of the following formulas (3)-1 to (3)-9.

 (3)-1

 (3)-2

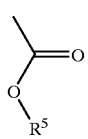 (3)-3

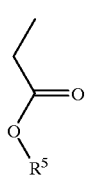 (3)-4

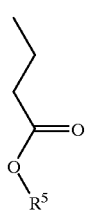 (3)-5

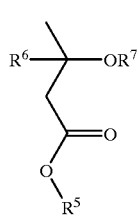 (3)-6

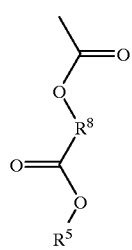 (3)-7

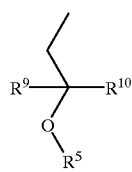 (3)-8

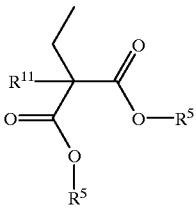 (3)-9

Herein, $R^5$ is a fluorinated alkyl group which may contain an ether or ester bond; $R^6$ and $R^{11}$ each are hydrogen or a straight alkyl group of 1 to 10 carbon atoms, $R^7$ is hydrogen, a straight alkyl group of 1 to 10 carbon atoms, or —C=O—$R^{12}$ wherein $R^{12}$ is hydrogen or a straight alkyl group of 1 to 10 carbon atoms; $R^8$ is an alkylene group of 1 to 10 carbon atoms; either one or both of $R^9$ and $R^{10}$ are alkyl groups of 1 to 5 carbon atoms having at least one fluorine atom substituted thereon.

Preferably, $R^5$ is a straight, branched or cyclic alkyl group of 1 to 20 carbon atoms which contains at least one fluorine atom and which may contain an ether or ester bond. Illustrative examples are substituents of the following formulas (4)-1 to (4)-11.

—$CF_3$     (4)-1

—$CH_2CF_3$     (4)-2

—$CH_2CF_2CF_3$     (4)-3

—$CF_2CF_2CF_3$     (4)-4

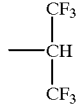 (4)-5

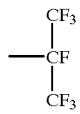 (4)-6

-continued

 (4)-7

 (4)-8

 (4)-9

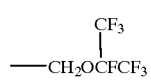 (4)-10

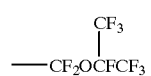 (4)-11

In a preferred embodiment, the inventive polymer comprises recurring units containing acid labile groups in addition to the above units.

The recurring units containing acid labile groups are desirably those units having a carbon-to-carbon double bond and capable of copolymerizing with the recurring units of formula (1), for example, units of (meth)acrylic derivatives, styrene derivatives, norbornene derivatives, tricyclodecene derivatives, tetracyclododecene derivatives, maleimide derivatives, and vinyl alcohol derivatives.

The (meth)acrylic derivatives are exemplified by the following formulas (5)-1 and (5)-2.

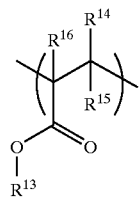 (5)-1

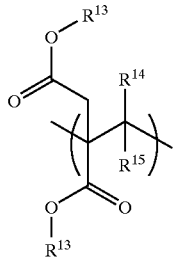 (5)-2

Herein, $R^{13}$ is an acid labile group, each of $R^{14}$, $R^{15}$ and $R^{16}$ is a hydrogen atom, fluorine atom, or a straight, branched or cyclic alkyl group of 1 to 10 carbon atoms, which may be substituted with fluorine.

The styrene derivatives are exemplified by the following formula (6).

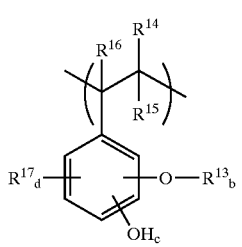 (6)

Herein, $R^{13}$, $R^{14}$, $R^{15}$ and $R^{16}$ are as defined above, $R^{17}$ is a hydrogen atom, fluorine atom, or a straight, branched or cyclic alkyl group of 1 to 10 carbon atoms, which may be substituted with fluorine, b is a positive number of 1 to 5, c and d each are 0 or a positive number of 1 to 4.

The norbornene derivatives are exemplified by the following formulas (7)-1 to (7)-7.

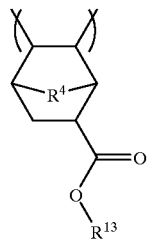 (7)-1

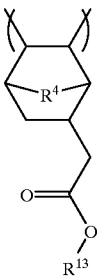 (7)-2

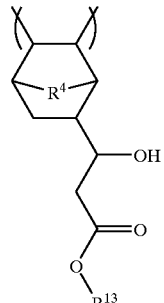 (7)-3

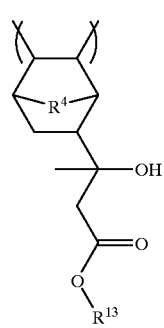 (7)-4

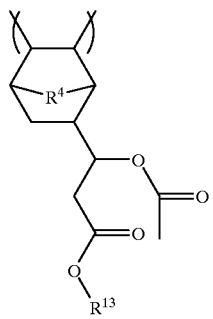 (7)-5

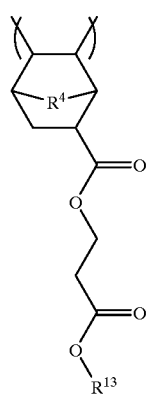
(7)-6
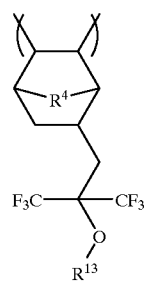
(7)-7
Herein, $R^4$ and $R^{13}$ are as defined above.
The tricyclodecene derivatives are exemplified by the following formulas (8)-1 to (8)-14.
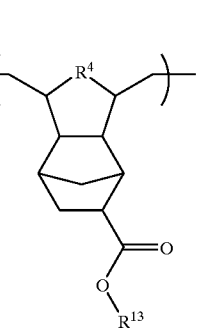
(8)-1
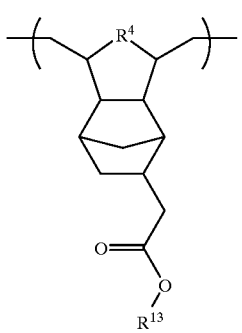
(8)-2
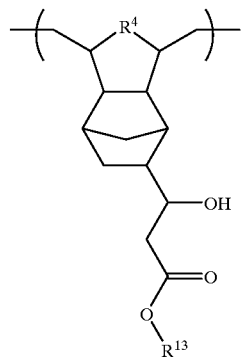
(8)-3
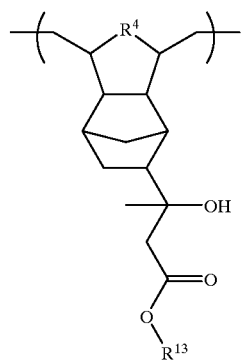
(8)-4
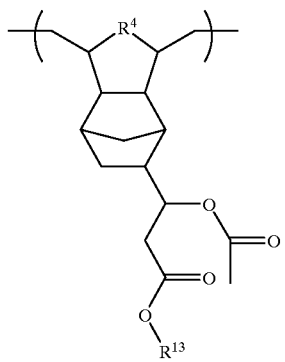
(8)-5
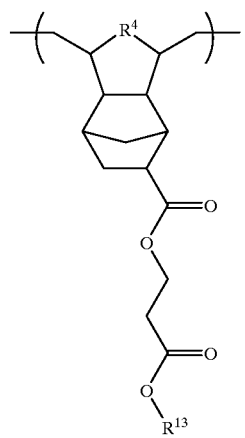
(8)-6

(8)-7
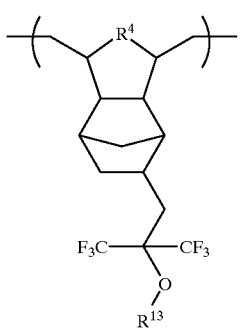
(8)-8
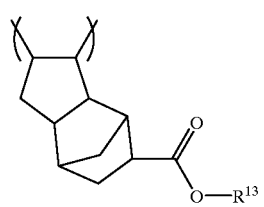
(8)-9
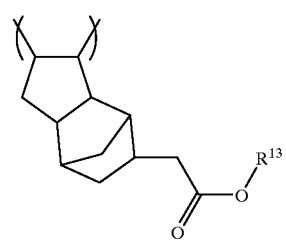
(8)-10
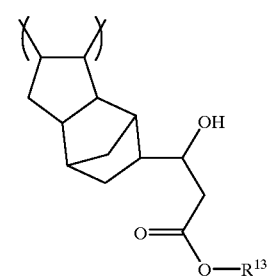
(8)-11
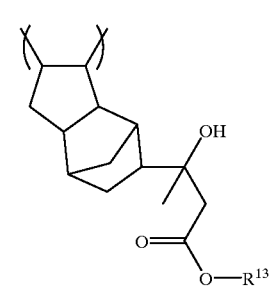
(8)-12
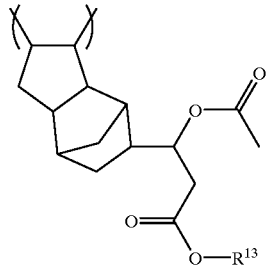
(8)-13
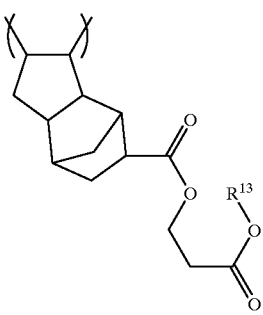
(8)-14
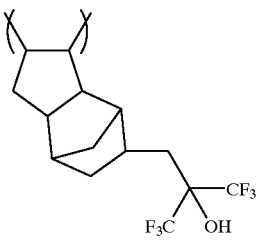
Herein, $R^4$ and $R^{13}$ are as defined above.
The maleimide derivatives are exemplified by the following formulas (10)-1 and (10)-2.
(9)-1
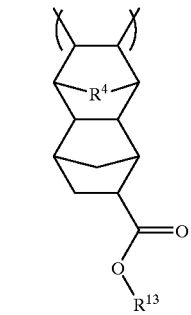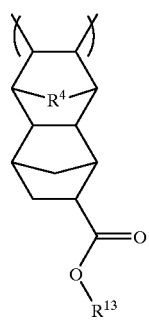

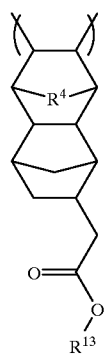 (9)-2
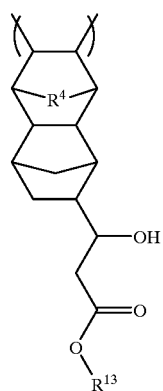 (9)-3
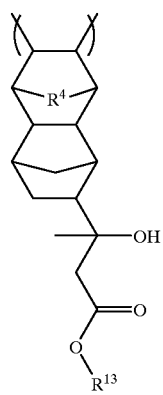 (9)-4
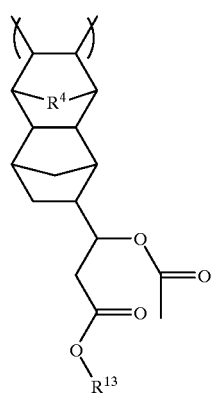 (9)-5
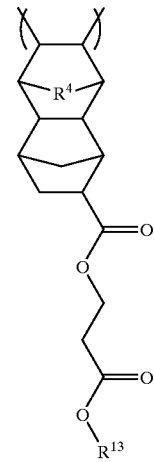 (9)-6
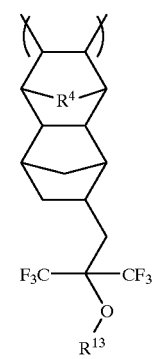 (9)-7
Herein, $R^4$ and $R^{13}$ are as defined above.
The maleimide derivatives are exemplified by the following formulas (10)-1 and (10)-2.
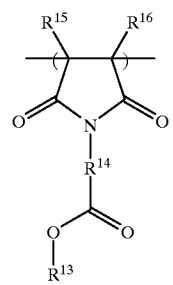 (10)-1
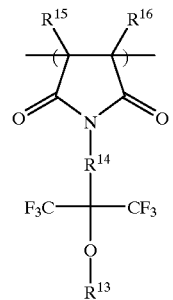 (10)-2

Herein, $R^{13}$ is as defined above, $R^{14}$ is a single bond or an alkylene group of 1 to 10 carbon atoms, $R^{15}$ and $R^{16}$ each are hydrogen, fluorine, methyl or trifluoromethyl.

The vinyl alcohol derivatives are exemplified by the following formula (11).

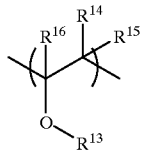

(11)

Herein, $R^{13}$, $R^{14}$, $R^{15}$ and $R^{16}$ are as defined above.

The acid labile group represented by $R^{13}$ is selected from a variety of such groups, preferably from among the groups of the following formulas (12) and (13), tertiary alkyl groups with 4 to 40 carbon atoms of the following formula (14), trialkylsilyl groups whose alkyl groups each have 1 to 6 carbon atoms, and oxoalkyl groups of 4 to 20 carbon atoms.

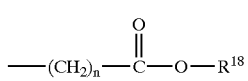

(12)

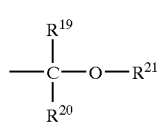

(13)

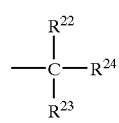

(14)

In formulas (12) and (13), $R^{18}$ and $R^{21}$ each are a straight, branched or cyclic alkyl group of 1 to 20 carbon atoms, which may contain a hetero atom such as oxygen, sulfur, nitrogen or fluorine; $R^{19}$ and $R^{20}$ each are hydrogen, a straight, branched or cyclic alkyl group of 1 to 20 carbon atoms, which may contain a hetero atom such as oxygen, sulfur, nitrogen or fluorine; and n is 0 or an integer of 1 to 10. A pair of $R^{19}$ and $R^{20}$, a pair of $R^{19}$ and $R^{21}$ or a pair of $R^{20}$ and $R^{21}$ may bond together to form a ring.

Preferably, $R^{18}$ to $R^{21}$ are as illustrated below.

$R^{18}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (14). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxolan-4-yl. Letter "a" is an integer of 0 to 6.

In formula (13), $R^{19}$ and $R^{20}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{21}$ is a monovalent hydrocarbon group of 1 to 18 carbon atoms, preferably 1 to 10 carbon atoms, which may have a hetero atom such as oxygen atom, for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

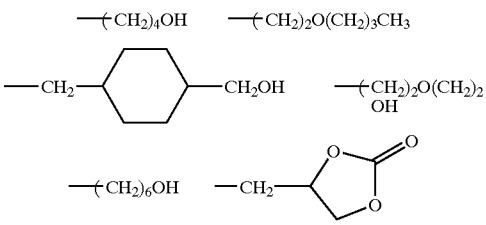

A pair of $R^{19}$ and $R^{20}{}_1$, a pair of $R^{19}$ and $R^{21}$, or a pair of $R^{20}$ and $R^{21}$, taken together, may form a ring. Each of $R^{19}$, $R^{20}$ and $R^{21}$ is a straight or branched alkylene group of 1 to 18 carbon atoms, preferably 1 to 10 carbon atoms, when they form a ring.

Illustrative examples of the acid labile groups of formula (12) include tert-butoxycarbonyl, tert-butoxy-carbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyl-oxycarbonyl, 1-ethylcyclopentyloxycarbonylmethyl, 1-ethyl-2-cyclopentenyloxycarbonyl, 1-ethyl-2-cyclopentenyl-oxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (13), illustrative examples of the straight or branched groups are given below.

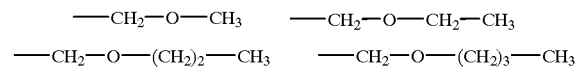
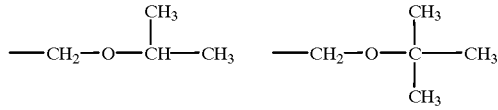
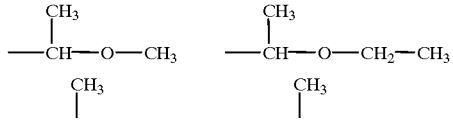
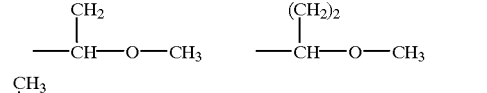
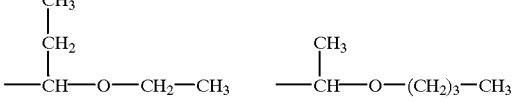
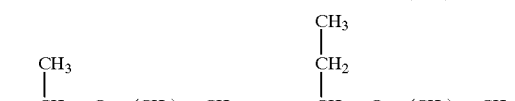
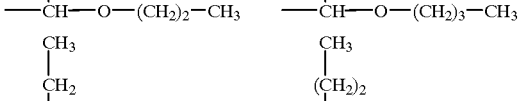
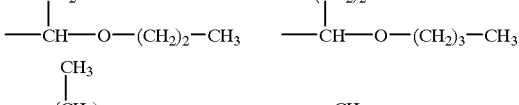
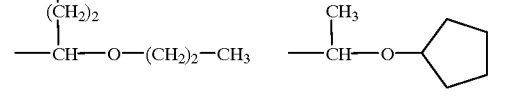

-continued

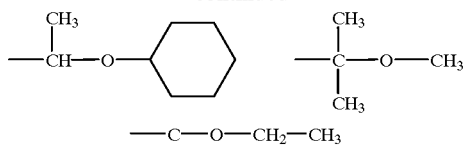

Of the acid labile groups of formula (13), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (13) are ethoxyethyl, butoxyethyl and ethoxypropyl.

In formula (14), $R^{22}$, $R^{23}$ and $R^{24}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{22}$ and $R^{23}$, a pair of $R^{22}$ and $R^{24}$, or a pair of $R^{23}$ and $R^{24}$, taken together, may form a ring.

Examples of the tertiary alkyl group represented by formula (14) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (15-1) through (15-16).

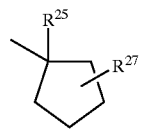
(15-1)

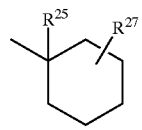
(15-2)

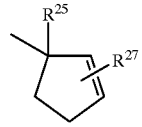
(15-3)

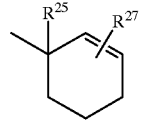
(15-4)

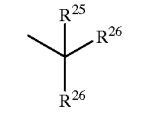
(15-5)

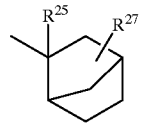
(15-6)

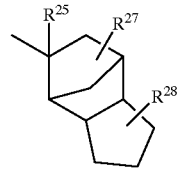
(15-7)

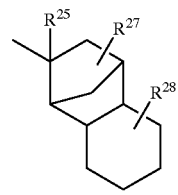
(15-8)

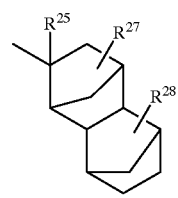
(15-9)

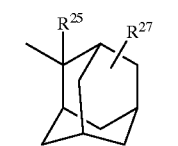
(15-10)

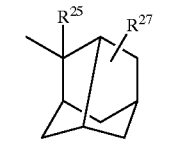
(15-11)

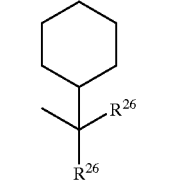
(15-12)

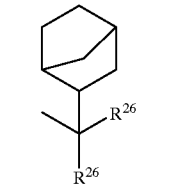
(15-13)

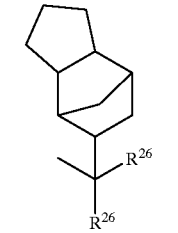
(15-14)

-continued (15-15)

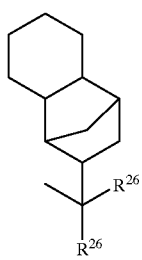

(15-16)

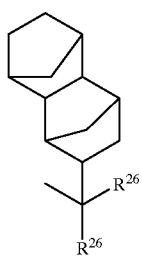

Herein, each of $R^{25}$ and $R^{26}$ is a straight, branched or cyclic alkyl group of 1 to 6 carbon atoms, for example, methyl, ethyl, propyl, isopropyl, n-butyl, sec-butyl, n-pentyl, n-hexyl, cyclopropyl or cyclopropylmethyl. $R^{27}$ is hydrogen, a monovalent hydrocarbon group of 1 to 6 carbon atoms which may contain a hetero atom, or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=)—, —NH$_2$, —NHR, —NR$_2$, —NH—, or —NR— wherein R is an alkyl group of 1 to 20 carbon atoms, and especially 1 to 16 carbon atoms. $R^{28}$ is hydrogen or an alkyl, hydroxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^{13}$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

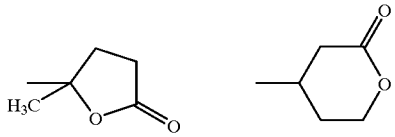

Also included are fluorine-containing acid labile groups of the following general formula (16).

(16)

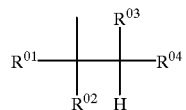

Herein, each of $R^{01}$, $R^{02}$, $R^{03}$, and $R^{04}$ is a hydrogen atom, a fluorine atom or an unsubstituted or fluorinated, straight, branched or cyclic alkyl group of 1 to 20 carbon atoms.

More illustratively, the groups are shown by the following formulas (16)-1 to (16)-3.

(16)-1

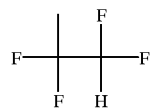

(16)-2

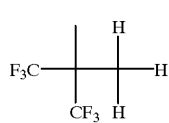

(16)-3

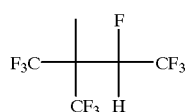

When copolymers comprising units of formula (1) and acid labile group-containing units are prepared by polymerizing the corresponding monomers, there can be added an additional monomer, specifically a monomer having a substituent for improving adhesion, a monomer for improving dry etching resistance, and/or a (meth)acrylate monomer. The adhesion-improving monomer used herein is one containing a hydrophilic substituent such as a phenol, acid anhydride, ester (lactone), carbonate, alcohol, carboxylic acid, carboxylic amide, sulfonic amide or ketone group, for example, monomers of the following formulas (17)-1 to (17)-29.

(17)-1

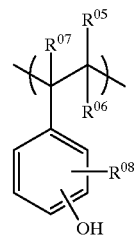

(17)-2

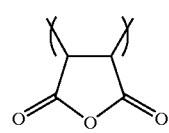

(17)-3

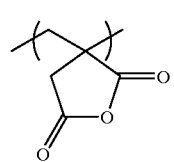

(17)-4

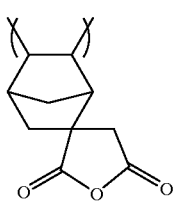

(17)-5
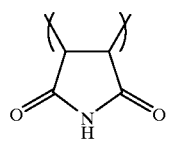
(17)-6
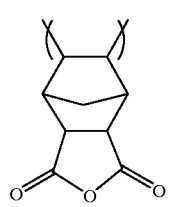
(17)-7
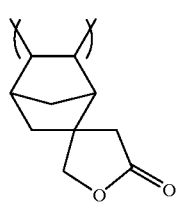
(17)-8
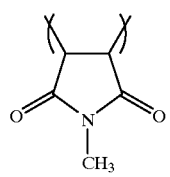
(17)-9
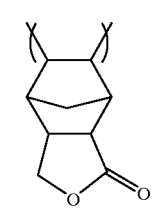
(17)-10
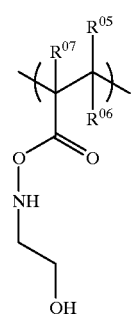
(17)-11
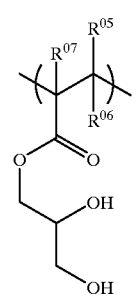
(17)-12
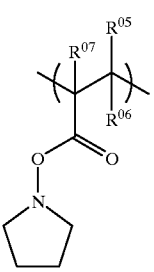
(17)-13
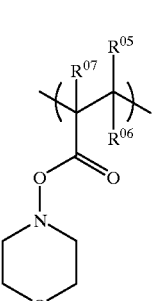
(17)-14
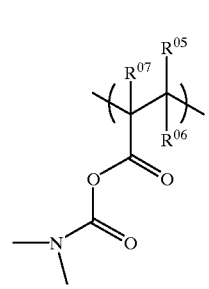
(17)-15
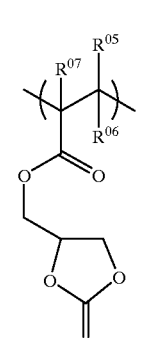
(17)-16
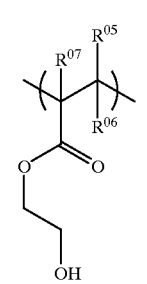

(17)-17 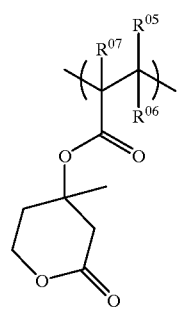
(17)-18
(17)-19
(17)-20
(17)-21 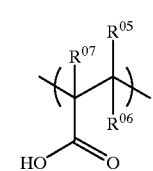
(17)-22 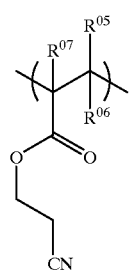
(17)-23 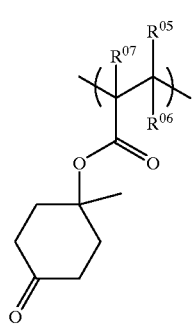
(17)-24 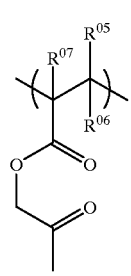
(17)-25 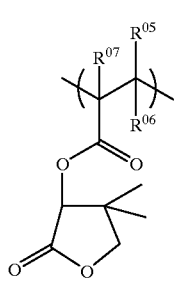
(17)-26 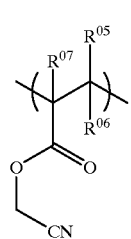

(17)-27

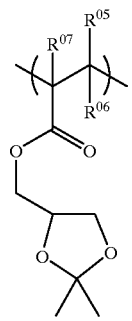

(17)-28

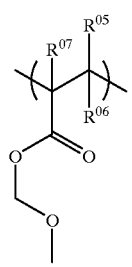

(17)-29

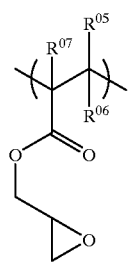

Herein, each of $R^{05}$, $R^{06}$, $R^{07}$, and $R^{08}$ is a hydrogen atom, a fluorine atom or an unsubstituted or fluorinated, straight, branched or cyclic alkyl group of 1 to 20 carbon atoms.

The polymer or high molecular weight compound is generally prepared by mixing a polymerizable monomer corresponding to the units of formula (1) and preferably, a monomer corresponding to the acid labile group-containing units, and an optional monomer corresponding to units of formulas (17)-1 to (17)-29 with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for the polymerization of the monomers are radical polymerization of triggering polymerization with radicals of α,α'-azobisisobutyronitrile (AIBN) or the like, ion (anion) polymerization using catalysts such as alkyl lithium, and ring-opening polymerization using metal catalysts. Such polymerization may be effected in a conventional manner.

The polymer of the invention preferably has a weight average molecular weight of about 1,000 to 1,000,000, and especially about 2,000 to 100,000.

The polymer of the invention is useful in resist compositions, and especially chemical amplification type positive resist compositions.

Resist Composition

A second aspect of the invention is a resist composition comprising the polymer defined above as a base resin, and preferably a chemical amplification positive resist composition comprising (A) the polymer defined above as a base resin, (B) an organic solvent, and (C) a photoacid generator.

In preferred embodiments, the resist composition may further contain (D) a basic compound and/or (E) a dissolution inhibitor.

Component (B)

The organic solvent used as component (B) in the invention may be any organic solvent in which the photoacid generator, base resin (inventive polymer), dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoro-acetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluoro-butyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluoro-nonanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluoro-butyltetrahydrofuran, perfluoro(butyltetrahydrofuran), perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione. These solvents may be used alone or in combinations of two or more thereof.

Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (C)

Suitable examples of the photoacid generator (C) include onium salts of general formula (18) below, diazomethane derivatives of formula (19), glyoxime derivatives of formula (20), β-ketosulfone derivatives, disulfone derivatives, nitrobenzylsulfonate derivatives, sulfonic acid ester derivatives, and imidoyl sulfonate derivatives.

(18)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butyl-phenyl, and dimethylphenyl. Exemplary aralkyl groups include benzyl and phenethyl. Examples of the non-nucleophilic nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

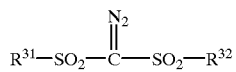

(19)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluoro-butyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

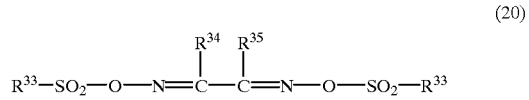

(20)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutane-sulfonate, triphenylsulfonium butanesulfonate, trimethyl-sulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenyl-sulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl)diazomethane, bis(isobutylsulfonyl)-diazomethane, bis(sec-butylsulfonyl)diazomethane, bis(n-propylsulfonyl)diazomethane, bis(isopropylsulfonyl)-diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)-diazomethane, 1-cyclohexylsulfonyl-1-(tert-butylsulfonyl)-diazomethane, 1-cyclohexylsulfonyl-1-(tert-amylsulfonyl)-diazomethane, and 1-tert-amylsulfonyl-1-(tert-butylsulfonyl)diazomethane;

glyoxime derivatives such as bis-o-(p-toluene-sulfonyl)-α-dimethylglyoxime, bis-o-(p-toluenesulfonyl)-α-diphenylglyoxime, bis-o-(p-toluenesulfonyl)-α-dicyclohexyl-glyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α- diphenylgyoxime, bis-o-(n-butanesulfonyl)-α-dicyclohexylglyoxime, bis-o-(n-butane-sulfonyl)-2,3-pentanedioneglyoxime, bis-o-(n-butane-sulfonyl)-2-methyl-3,4-pentanedioneglyoxime, bis-o-(methanesulfonyl)-α-dimethylglyoxime, bis-o-(trifluoro-methanesulfonyl)-α-dimethylglyoxime, bis-o-(1,1,1-trifluoro-ethanesulfonyl)-α-dimethylglyoxime, bis-o-(tert-butanesulfonyl)-α-dimethylglyoxime, bis-o-(perfluoro-octanesulfonyl)-α-dimethylglyoxime, bis-o-(cyclohexane-sulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexyl-carbonyl-2-(p-toluenesulfonyl)propane and 2-isopropyl-carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoro-methanesulfonyloxy)benzene, and 1,2,3-tris(p-toluene-sulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethane-sulfonate, tris(p-tert-butoxyphenyl)sulfonium trifluoro-methanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)-diazomethane, bis(p-toluenesulfonyl) diazomethane, bis(cyclohexylsulfonyl)diazomethane, bis(n-butylsulfonyl)-diazomethane, bis(isobutylsulfonyl) diazomethane, bis(sec-butylsulfonyl)diazomethane, bis(n-propylsulfonyl)-diazomethane, bis(isopropylsulfonyl) diazomethane, and bis(tert-butylsulfonyl)diazomethane; and glyoxime derivatives such as bis-o-(p-toluenesulfonyl)-α-dimethyl-glyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropyl-amine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylene-diamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethyl-ethylamine, methylethylpropylamine, benzylamine, phenethyl-amine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethyl-ethanolamine, triisopropanolamine, 2,2'-iminodiethanol, 2-aminoethanol, 3-amino-1-propanol, 4-amino-l-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)-isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (21) and (22) may also be included.

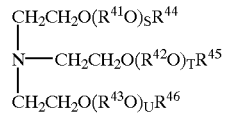

(21)

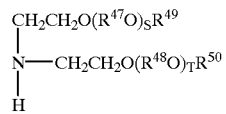

(22)

In the formulas, $R^{41}$, $R^{42}$ $R^{43}$ $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (21) and (22) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)-ethyl}amine, tris{2-(1-methoxyethoxy)ethyl}amine, tris{2-(1-ethoxyethoxy)ethyl}amine, tris{2-(1-ethoxypropoxy)-ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)-ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of the base resin. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include 4,4'-(1- methylethylidene)bisphenol, (1,1'-biphenyl-4,4'-diol)-2,2'-methylenebis(4-methylphenol), 4,4-bis(4'-hydroxyphenyl)-valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as illustrated above for $R^{13}$.

Illustrative, non-limiting, examples of the dissolution inhibitors which are useful herein include 3,3',5,5'-tetrafluoro[(1,1'-biphenyl)-4,4'-di-t-butoxy-carbonyl], 4,4'-[2,2,2-trifluoro-1-(trifluoromethyl)-ethylidene]bisphenol-4,4'-di-t-butoxycarbonyl, bis(4-(2'-tetrahydropyranyloxy)phenyl)methane, bis(4-(2'-tetrahydro-furanyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxy-ethoxy)phenyl)methane, bis(4-(1'-ethoxypropyloxy)phenyl)-methane, 2,2-bis(4'-(2"-tetrahydropyranyloxy))propane, 2,2-bis(4'-(2"-tetrahydrofuranyloxy)phenyl)propan 2,2-bis(4'-tert-butoxyphenyl)propane, 2,2-bis(4'-tert-butoxy-carbonyloxyphenyl)propane, 2,2-bis(4-tert-butoxycarbonyl-methyloxyphenyl)propane, 2,2-bis(4'-(1"-ethoxyethoxy)-phenyl)propane, 2,2-bis(4'-(1"-ethoxypropyloxy)phenyl)-propane, tert-butyl 4,4-bis(4'-(2"-tetrahydropyranyloxy)-phenyl)valerate, tert-butyl 4,4-bis(4'-(2"-tetrahydro-furanyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydro-naphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 µm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micropattern formation with, in particular, deep-UV rays having a wavelength of 254 to 120 nm, an excimer laser, especially ArF excimer laser (193 nm), F$_2$ excimer laser (157 nm), Kr$_2$ excimer laser (146 nm), KrAr excimer laser (134 nm) or Ar$_2$ excimer laser (126 nm), x-rays, or an electron beam. The desired pattern may not be obtainable outside the upper and lower limits of the above range.

The resist composition comprising the polymer of the invention is sensitive to high-energy radiation, has excellent sensitivity and resolution at a wavelength of less than 200 nm, especially less than 170 nm, and excellent plasma etching resistance. Because these features of the inventive resist composition enable its use particularly as a resist having a low absorption at the exposure wavelength of a F$_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are AIBN for α,α'-azobisisobutyronitrile, GPC for gel permeation chromatography, NMR for nuclear magnetic resonance, Mw for weight average molecular weight, and Mn for number average molecular weight.

Synthesis Example 1

Synthesis of 2,2,2-trifluoroethyl bicyclo[2.2.1]hept-5-ene-2-carboxylate

A 500-ml three-necked flask was charged with 62.0 g of cyclopentadiene resulting from pyrolysis of dicyclopentadiene. While the flask was placed in a water bath to keep the reaction temperature below 25° C., 125.6 g of 2,2,2-trifluoroethyl acrylate was added dropwise. The water bath was removed at the end of dropwise addition, and stirring was continued overnight. The resulting oily substance was distilled in vacuum, collecting 147.2 g of 2,2,2-trifluoroethyl bicyclo[2.2.1]hept-5-ene-2-carboxylate. The yield was 82.0%.

Synthesis Example 2

Synthesis of 1-ethylcyclopentyl bicyclo[2.2.1]hept-5-ene-2-carboxylate

In a 1-liter four-necked flask, 75.3 g of 1-ethylcyclopentanol was dissolved in 300 g of methylene chloride. While the flask was placed in an ice bath, 65.7 g of acrylic chloride and a spoonful of dimethylaminopyridine were admitted into the flask. While the reaction temperature was kept below 15° C., 113.4 g of triethylamine was added dropwise. The ice bath was removed at the end of dropwise addition, and stirring was continued for 3 hours, followed by ordinary post-treatment. The resulting oily substance was distilled in vacuum, collecting 86.8 g of 1-ethylcyclopentyl acrylate. The yield was 78.2%.

Using 85.0 g of 1-ethylcyclopentyl acrylate, reaction was carried out as in Synthesis Example 1. There was obtained 89.2 g of 1-ethylcyclopentyl bicyclo[2.2.1]hept-5-ene-2-carboxylate. The yield was 75.3%.

Synthesis Example 3

Synthesis of Monomer 1

A 1-liter three-necked flask was charged with 22.5 g of sodium hydride, and 350 g of dimethylformamide was admitted thereto. While the flask was placed in an ice bath to keep the reaction temperature below 0° C., 75.7 g of maleimide was added dropwise. The ice bath was removed at the end of dropwise addition, and the reaction solution was ripened for 2 hours. While the flask was placed in a water bath to keep the reaction temperature below 15° C., 123.3 g of tert-butyl chloroacetate was added dropwise. The water bath was removed at the end of dropwise addition, and stirring was continued for 3 hours, followed by ordinary post-treatment. The resulting oily substance was distilled in vacuum, collecting 134.2 g of Monomer 1 shown below. The yield was 81.5%.

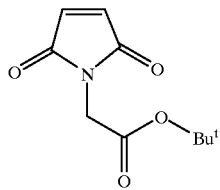

Monomer 1

Synthesis Example 4

Ternary Copolymerization Reaction of 2,2,2-trifluoroethyl bicyclo[2.2.1]hept-5-ene-2-carboxylate, 1-ethylcyclopentyl bicyclo[2.2.1]hept-5-ene-2-carboxylate, and Maleic Anhydride A 1-liter flask was charged with 75 g of 2,2,2-trifluoroethyl bicyclo[2.2.1]hept-5-ene-2-carboxylate, 80 g of 1-ethylcyclopentyl bicyclo[2.2.1]hept-5-ene-2-carboxylate, 67 g of maleic anhydride and 43 g of dioxane as a solvent. The reactor was cooled to −70° C. in a nitrogen atmosphere, following which vacuum evacuation and nitrogen flow were repeated three times. The flask was warmed up to room temperature whereupon 9.0 g of an initiator AIBN was added. The flask was heated at 60° C., at which reaction was effected for 15 hours. The reaction solution was poured into 10 liters of isopropyl alcohol whereupon a white solid precipitated. The solid was collected by filtration and dried in vacuum at 60° C., obtaining 173.8 g of a white polymer.

The polymer was analyzed by $^{13}$C-NMR, $^1$H-NMR and GPC, with the following analytical results.

Copolymer Composition
2,2,2-trifluoroethyl bicyclo[2.2.1]hept-5-ene-2-carboxylate:1-ethylcyclopentyl bicyclo[2.2.1]hept-5-ene-2-carboxylate:maleic anhydride =25:25:50

Mw =8,700

Molecular weight dispersity (Mw/Mn) =1.63

Synthesis Example 5

Ternary Copolymerization Reaction of 2,2,2-trifluoroethyl bicyclo[2.2.1]hept-5-ene-2-carboxylate, 1-ethylcyclopentyl bicyclo[2.2.1]hept-5-ene-2-carboxylate, and N-methylmaleimide A 1-liter flask was charged with 77 g of 2,2,2-trifluoroethyl bicyclo[2.2.1]hept-5-ene-2-carboxylate, 85 g of 1-ethylcyclopentyl bicyclo[2.2.1]hept-5-ene-2-carboxylate, 70 g of N-methylmaleimide and 43 g of dioxane as a solvent. The reactor was cooled to −70° C. in a nitrogen atmosphere, following which vacuum evacuation and nitrogen flow were repeated three times. The flask was warmed up to room temperature whereupon 8.4 g of an initiator AIBN was added. The flask was heated at 60° C., at which reaction was effected for 15 hours. The reaction solution was poured into 10 liters of isopropyl alcohol whereupon a white solid precipitated. The solid was collected by filtration and dried in vacuum at 60° C., obtaining 160.8 g of a white polymer.

The polymer was analyzed by $^{13}$C-NMR, $^1$H-NMR and GPC, with the following analytical results.

Copolymer Composition
2,2,2-trifluoroethyl bicyclo[2.2.1]hept-5-ene-2-carboxylate:1-ethylcyclopentyl bicyclo[2.2.1]hept-5-ene-2-carboxylate:N-methylmaleimide=25:25:50

Mw =8,400

Molecular weight dispersity (Mw/Mn)=1.59

Synthesis Example 6

Binary Copolymerization Reaction of 2,2,2-trifluoroethyl bicyclo[2.2.1]hept-5-ene-2-carboxylate and Monomer 1

A 1-liter flask was charged with 135.5 g of 2,2,2-trifluoroethyl bicyclo[2.2.1]hept-5-ene-2-carboxylate, 130.0 g of Monomer 1, and 74 g of dioxane as a solvent. The reactor was cooled to −70° C. in a nitrogen atmosphere, following which vacuum evacuation and nitrogen flow were repeated three times. The flask was warmed up to room temperature whereupon 8.1 g of an initiator AIBN was added. The flask was heated at 60° C., at which reaction was effected for 15 hours. The reaction solution was poured into 10 liters of isopropyl alcohol whereupon a white solid precipitated. The solid was collected by filtration and dried in vacuum at 60° C., obtaining 217.7 g of a white polymer.

The polymer was analyzed by $^{13}$C-NMR, $^{1}$H-NMR and GPC, with the following analytical results.

Copolymer Composition
2,2,2-trifluoroethyl bicyclo[2.2.1]hept-5-ene-2-carboxylate:Monomer 1=50:50
Mw =9,200
Molecular weight dispersity (Mw/Mn) =1.53

Comparative Synthesis Example 1

Binary Copolymerization Reaction of 1-ethylcyclopentyl bicyclo[2.2.1]hept-5-ene-2-carboxylate and N-methylmaleimide In a 500-ml flask, 25 g of 1-ethylcyclopentyl bicyclo[2.2.1]hept-5-ene-2-carboxylate and 22 g of N-methylmaleimide were dissolved in 120 ml of toluene. Oxygen was thoroughly removed from the system, following which 0.66 g of an initiator AIBN was added. The flask was heated at 60° C., at which polymerization reaction was effected for 24 hours. For purifying the resulting polymer, the reaction solution was poured into methanol whereupon the polymer precipitated. The procedure of dissolving the collected polymer in acetone and pouring into 5 liters of methanol for precipitation was repeated twice. The polymer was separated and dried, which is designated Comparative Polymer 1.

Copolymer Composition
1-ethylcyclopentyl bicyclo[2.2.1]hept-5-ene-2-carboxylate:N-methylmaleimide=50:50
Mw=9,700
Molecular weight dispersity (Mw/Mn) =1.63

Comparative Synthesis Example 2

Binary Copolymerization Reaction of Ethyladamantane Methacrylate and γ-Butyrolactone Methacrylate In a 500-ml flask, 20 g of ethyladamantane methacrylate and 16 g of γ-butyrolactone methacrylate were dissolved in 120 ml of toluene. Oxygen was thoroughly removed from the system, following which 0.66 g of an initiator AIBN was added. The flask was heated at 60° C., at which polymerization reaction was effected for 24 hours. For purifying the resulting polymer, the reaction solution was poured into methanol whereupon the polymer precipitated. The procedure of dissolving the collected polymer in acetone and pouring into 5 liters of methanol for precipitation was repeated twice. The polymer was separated and dried, which is designated Comparative Polymer 2.

Copolymer Composition
ethyladamantane methacrylate:γ-butyrolactone methacrylate=50:50
Mw=10,300
Molecular weight dispersity (Mw/Mn)=1.73
Comparative Polymers A polymer, designated Comparative Polymer 3, was synthesized from a monodisperse polyhydroxystyrene having a molecular weight of 10,000 and a dispersity (Mw/Mn) of 1.10 by substituting tetrahydropyranyl groups for 30% of the hydroxyl groups. Comparative Polymer 4 was poly(methyl methacrylate) having a molecular weight of 15,000 and a dispersity of 1.7. Comparative Polymer 5 was a novolac polymer having a meta/para ratio of 40/60, a molecular weight of 9,000 and a dispersity of 2.5.

Polymer Transmittance Measurement

Next, each of the polymers of Synthesis Examples (SE) 4 to 6 and Comparative Polymers 1 to 5, 1 g, was thoroughly dissolved in 10 g of propylene glycol monomethyl ether acetate (PGMEA), and passed through a 0.2-μm filter, obtaining a polymer solution.

The polymer solution was spin coated onto a MgF$_2$ substrate and baked on a hot plate at 100° C. for 90 seconds, forming a polymer layer of 300 nm thick on the MgF$_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| Polymer | Transmittance (%) at | | |
|---|---|---|---|
|  | 248 nm | 193 nm | 157 nm |
| Polymer of SE4 | 88 | 85 | 33 |
| Polymer of SE5 | 87 | 42 | 35 |
| Polymer of SE6 | 86 | 40 | 38 |
| Comparative Polymer 1 | 85 | 26 | 22 |
| Comparative Polymer 2 | 92 | 86 | 10 |
| Comparative Polymer 3 | 85 | 1 | 3 |
| Comparative Polymer 4 | 90 | 70 | 1 |
| Comparative Polymer 5 | 70 | 1 | 6 |

Dry Etching Test

Each of the polymers of Synthesis Examples (SE) 4 to 6 and Comparative Polymers 1 to 5, 2 g, was thoroughly dissolved in 10 g of propylene glycol monomethyl ether acetate (PGMEA), and passed through a 0.2-μm filter, obtaining a polymer solution.

The polymer solution was spin coated onto a silicon esgrt and baked at 100° C. for 90 seconds, forming a polymer film of 300 nm thick. Dry etching tests were carried out on the polymer films by etching them under two sets of conditions. The results are shown in Tables 2 and 3.

(1) Etching test with CHF$_3$/CF$_4$ gas

Using a dry etching instrument TE-8500P (Tokyo Electron K.K.), the difference in polymer film thickness before and after etching was determined. The surface roughness of the etched film was measured by AFM.

The etching conditions are given below.

| | |
|---|---|
| chamber pressure | 40.0 Pa |
| RF power | 1300 W |
| gap | 9 mm |
| CHF$_3$ gas flow rate | 30 ml/min |
| CF$_4$ gas flow rate | 30 ml/min |
| Ar gas flow rate | 100 ml/min |
| time | 60 sec |

(2) Etching test with $Cl_2/BCl_3$ gas

Using a dry etching instrument L-507D-L (Nichiden Anerba K.K.), the difference in polymer film thickness before and after etching was determined.

The etching conditions are given below.

| | |
|---|---|
| chamber pressure | 40.0 Pa |
| RF power | 300 W |
| gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| time | 60 sec |

TABLE 2

| Polymer | $CHF_3/CF_4$ gas etching rate (nm/min) | $Cl_2/BCl_3$ gas etching rate (nm/min) |
|---|---|---|
| Polymer of SE4 | 99 | 120 |
| Polymer of SE5 | 95 | 122 |
| Polymer of SE6 | 98 | 128 |
| Comparative Polymer 1 | 97 | 122 |
| Comparative Polymer 2 | 90 | 105 |
| Comparative Polymer 3 | 90 | 103 |
| Comparative Polymer 4 | 180 | 350 |
| Comparative Polymer 5 | 88 | 100 |

TABLE 3

| Polymer | Surface roughness Rms after $CHF_3/CF_4$ gas etching (nm) |
|---|---|
| Polymer of SE4 | 3.5 |
| Polymer of SE5 | 3.8 |
| Polymer of SE6 | 3.6 |
| Comparative Polymer 1 | 3.6 |
| Comparative Polymer 2 | 10.8 |
| Comparative Polymer 3 | 2.2 |
| Comparative Polymer 4 | 20.5 |
| Comparative Polymer 5 | 1.5 |

Examples and Comparative Examples

Resist solutions were prepared in a conventional manner by formulating the polymer, photoacid generator (PAG1 or PAG2), basic compound, dissolution inhibitor (DRI) and solvent in the amounts shown in Table 4.

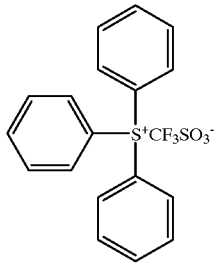
PAG1

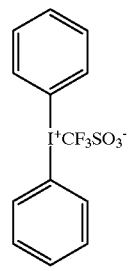
PAG2

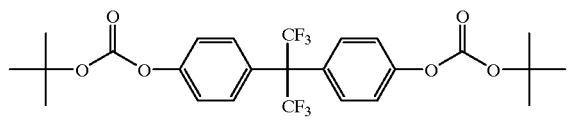
DRI

TBA:tributylamine
TEA:triethanolamine

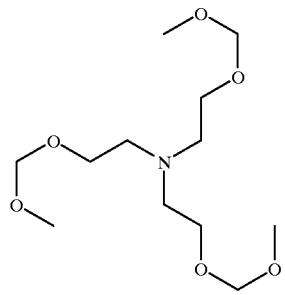
TMMEA

On silicon wafers, DUV-30 (Nissan Chemical K.K.) was coated to form films of 55 nm thick so that the reflectance to KrF light (248 nm) was reduced below 1%. On the coated substrates, the resist solutions were spin coated, then baked on a hot plate at 100° C. for 90 seconds to give resist films having a thickness of 300 nm.

The resist films were exposed to a line-and-space pattern through a chromium mask by means of an excimer laser stepper (NSR-S202A, from Nikon Corporation; NA 0.6, σ 0.75, 2/3 zone illumination). Immediately after exposure, the resist films were baked at 110° C. for 90 seconds and then developed for 60 seconds with a 2.38% aqueous solution of tetramethylammonium hydroxide, thereby giving positive patterns.

The resulting resist patterns were evaluated as described below. The results are shown in Table 4.
Evaluation:

The exposure dose which provided a 1:1 resolution at the top and bottom of a 0.20-μm line-and-space pattern was the optimum exposure dose (Eop), that is, a sensitivity (mJ/$cm^2$). The minimum line width (μm) of a line-and-space pattern which was ascertained separate at this dose was the resolution of a test resist.

TABLE 4

| Polymer (pbw) | Photoacid generator (pbw) | Basic compound (pbw) | Dissolution inhibitor/ crosslinker (pbw) | Solvent (pbw) | Sensitivity (mJ/cm$^2$) | Resolution ($\mu$m) |
|---|---|---|---|---|---|---|
| SE4 (100) | PAG1 (2) | TBA (0.1) | — | PGMEA (1000) | 40 | 0.18 |
| SE5 (100) | PAG1 (2) | TBA (0.1) | — | PGMEA (1000) | 40 | 0.18 |
| SE6 (100) | PAG1 (2) | TBA (0.1) | — | PGMEA (1000) | 32 | 0.17 |
| SE6 (100) | PAG1 (2) | TBA (0.1) | DRI (20) | PGMEA (1000) | 30 | 0.18 |
| SE6 (100) | PAG2 (2) | TBA (0.1) | — | PGMEA (1000) | 22 | 0.17 |
| SE6 (100) | PAG1 (2) | TEA (0.1) | — | PGMEA (1000) | 38 | 0.17 |
| SE6 (100) | PAG1 (2) | TMMEA (0.2) | — | PGMEA (1000) | 40 | 0.17 |
| CSE1 (100) | PAG1 (2) | TBA (0.1) | — | PGMEA (1000) | 45 | 0.18 |
| CSE2 (100) | PAG1 (2) | TBA (0.1) | — | PGMEA (1000) | 25 | 0.16 |

Note)
SE is Synthesis Example and
CSE is Comparative Synthesis Example.

As is evident from Tables 1 to 4, resist materials using the polymers of the invention have sufficient transparency at the wavelength (157 nm) of F$_2$ excimer laser and satisfy the resolution and sensitivity requirements. The difference in resist film thickness before and after etching is small and the surface roughness after etching is small enough, indicating superior dry etching resistance.

Japanese Patent Application No. 2000-127513 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of compound of formula (1):

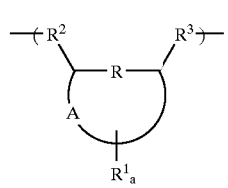

(1)

wherein

A is a divalent aliphatic or alicyclic hydrocarbon group of 2 to 20 carbon atoms, R$^1$ is selected from formulae (3)-3, (3)-4, (3)-5, (3)-6, (3)-7, (3)-8, and (3)-9

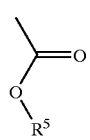

(3)-3

-continued

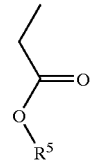

(3)-4

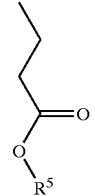

(3)-5

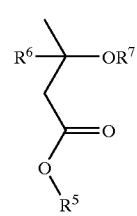

(3)-6

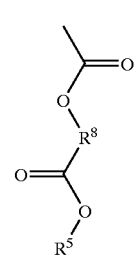

(3)-7

-continued

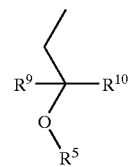
(3)-8

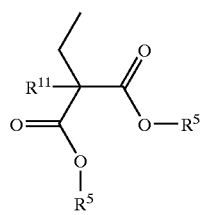
(3)-9

"a" is a positive number of 1 to 3,

R is a single bond, methylene group, oxygen atom, NH group or sulfur atom, $R^2$ and $R^3$ each are a single bond or methylene group, $R^5$ is a fluorinated alkyl group which optionally contains an ether or ester bond, $R^6$ and $R^{11}$ are, each independently, hydrogen or a straight alkyl group of 1 to 11 carbon atoms, $R^7$ is hydrogen, a straight alkyl group of 1 to 10 carbon atoms, or —C=O—$R^{12}$, $R^{12}$ is hydrogen or a straight alkyl group of 1 to 10 carbon atoms, and $R^8$ is an alkylene group of 1 to 10 carbon atoms, and either one or both of $R^9$ and $R^{10}$ are alkyl groups of 1 to 5 carbon atoms having at least one fluorine atom substituted thereon.

2. The polymer of claim 1 further comprising recurring units containing acid labile groups.

3. A chemically amplified resist composition comprising the polymer of claim 1.

4. A chemically amplified positive resist composition comprising (A) the polymer of claim 1, (B) an organic solvent, and (C) a photoacid generator.

5. The resist composition of claim 4 further comprising a basic compound.

6. The resist composition of claim 4 further comprising a dissolution inhibitor.

7. A process for forming a resist pattern comprising the steps of:

applying the resist composition of claim 4 onto a substrate to form a coating, heat treating the coating and then exposing it to high-energy radiation having a wavelength of up to 180 nm or electron beams through a photo mask, and optionally heat treating the exposed coating and developing it with a developer.

8. A polymer of claim 1, wherein R is a single bond or methylene.

9. A polymer of claim 1, wherein the recurring units of formula (1) are selected from formulae (2)-1, (2)-2, (2)-3, (2)-4, (2)-5, (2)-6, (2)-7, (2)-8, and (2)-9

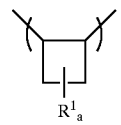
(2)-1

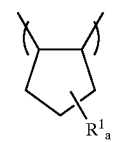
(2)-2

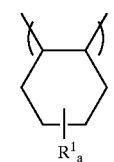
(2)-3

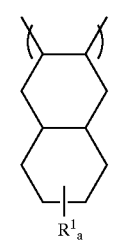
(2)-4

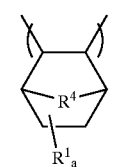
(2)-5

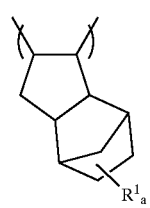
(2)-6

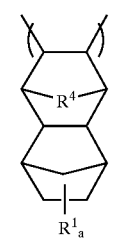
(2)-7

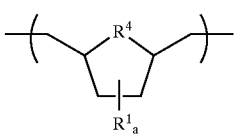
(2)-8

-continued (2)-9

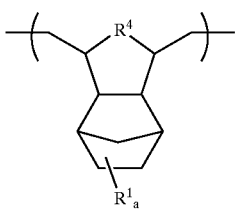

wherein

R⁴ is a methylene group, oxygen atom, NH group or sulfur atom, and

"a" is a positive number of 1 to 3.

10. A polymer of claim 1, further comprising recurring units of a (meth)acrylic compound of formula (5)-1 or (5)-2

(5)-1

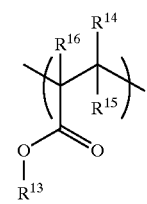

(5)-2

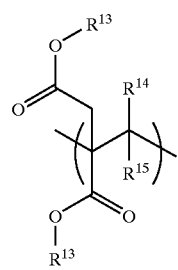

wherein $R^{13}$ is an acid labile group, and $R^{14}$, $R^{15}$ and $R^{16}$ are, each independently, a hydrogen atom, fluorine atom, or a straight, branched or cyclic alkyl group of 1 to 10 carbon atoms, which are, each independently, optionally substituted with fluorine.

11. A polymer according to claim 1, wherein said polymer has a weight average molecular weight of 1,000 to 1,000,000.

12. In a process of preparing a polymer, the improvement wherein a monomer of formula (1) of claim 1 is used.

13. In a process of forming a resist composition or a resist pattern, the improvement wherein a polymer of claim 1 is used.

14. A polymer of claim 1, wherein $R^1$ is selected from formulae (3)-3, (3)-4, (3)-5, (3)-6, (3)-7, and (3)-9

(3)-3

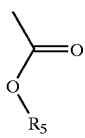

-continued (3)-4

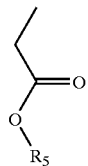

(3)-5

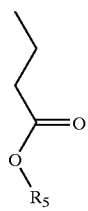

(3)-6

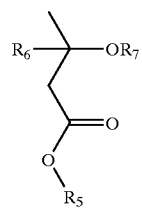

(3)-7

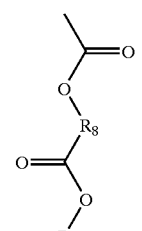

(3)-9

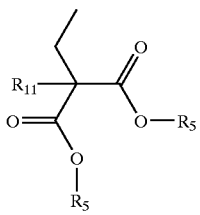

$R^5$ is a fluorinated alkyl group which optionally contains an ether or ester bond, $R^6$ and $R^{11}$ are, each independently, hydrogen or a straight alkyl group of 1 to 10 carbon atoms, $R^7$ is hydrogen, a straight alkyl group of 1 to 10 carbon atoms, or —C=O—$R^{12}$, $R^{12}$ is hydrogen or a straight alkyl group of 1 to 10 carbon atoms, and $R^8$ is an alkylene group of 1 to 10 carbon atoms.

15. A polymer according to claim 14, further comprising recurring units containing acid labile groups.

16. A chemically amplified resist composition comprising a polymer according to claim 14.

17. A chemically amplified positive resist composition comprising (A) the polymer of claim 14, (B) an organic solvent, and (C) a photoacid generator.

18. A resist composition according to claim 17, further comprising a basic compound.

19. A resist composition according to claim 17, further comprising a dissolution inhibitor.

20. A process for forming a resist pattern comprising the steps of:

applying a resist composition according to claim 17 onto a substrate to form a coating, heat treating the coating and then exposing it to high-energy radiation having a wavelength of up to 180 nm or electron beams through a photo mask, and optionally heat treating the exposed coating and developing it with a developer.

21. A polymer of claim 14, wherein R is a single bond or methylene.

22. A polymer of claim 14, wherein the recurring units of formula (1) are selected from formulae (2)-1, (2)-2, (2)-3, (2)-4, (2)-5, (2)-6, (2)-7, (2)-8, and (2)-9

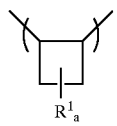
(2)-1

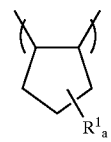
(2)-2

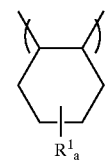
(2)-3

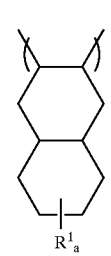
(2)-4

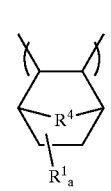
(2)-5

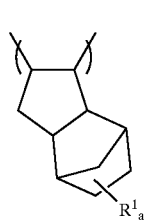
(2)-6

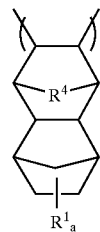
(2)-7

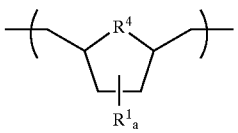
(2)-8

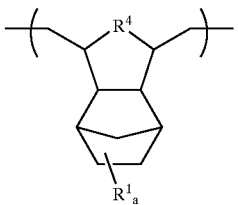
(2)-9 wherein $R^4$ is a methylene group, oxygen atom, NH group or sulfur atom, and

"a" is a positive number of 1 to 3.

23. A polymer comprising recurring units of a compound of formula (1):

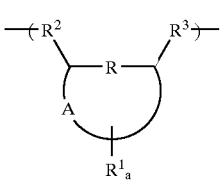
(1)

wherein A is a divalent aliphatic or alicyclic hydrocarbon up of 2 to 20 carbon atoms, $R^1$ is an alkyl group containing at least one fluorine atom, and which optionally contains a hetero atom, "a" is a positive number of 1 to 3, R is a single bond, ethylene group, oxygen atom, NH group or sulfur atom, and $R^2$ and $R^3$ each are a single bond or methylene group, wherein the recurring units of formula (1) are selected from formulae (2) 1, (2)-2, (2)-3, (2)-4, (2)-5, (2)-6, (2)-7, (2)-8, and (2)-9

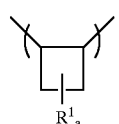
(2)-1

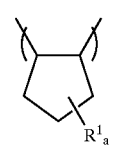
(2)-2

-continued
(2)-3 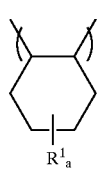
(2)-4 
(2)-5 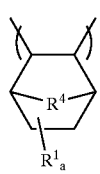
(2)-6 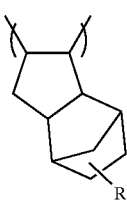
(2)-7 
(2)-8 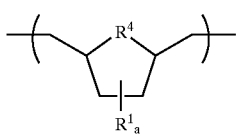
(2)-9 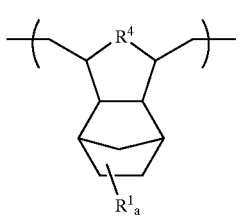
wherein
$R^4$ is a methylene group, oxygen atom, NH group or sulfur atom,
"a" is a positive number of 1 to 3,
$R^1$ is selected from formulae (3)-1, (3)-2, (3)-3, (3)-4, (3)-5, (3)-6, (3)-7, (3)-8, and (3)-9
(3)-1 
(3)-2 
(3)-3 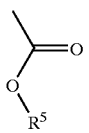
(3)-4 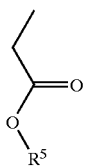
(3)-5 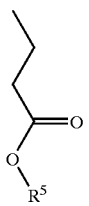
(3)-6 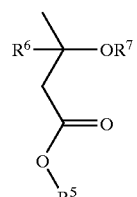
(3)-7 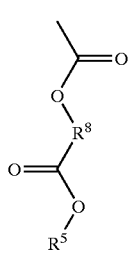
(3)-8 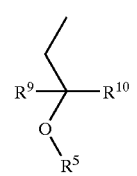

-continued (3)-9

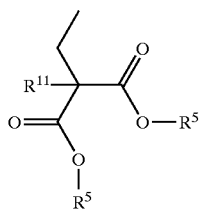

$R^6$ and $R^{11}$ are, each independently, hydrogen or a straight alkyl group of 1 to 10 carbon atoms, $R^7$ is hydrogen, a straight alkyl group of 1 to 10 carbon atoms, or —C=O—$R^{12}$, $R^{12}$ is hydrogen or a straight alkyl group of 1 to 10 carbon atoms, and $R^8$ is an alkylene group of 1 to 10 carbon atoms, wherein either one or both of $R^9$ and $R^{10}$ are alkyl groups of to 5 carbon atoms having at least one fluorine atom substituted thereon, and $R^5$ is selected from formulae (4)-1, (4)-2, (4)-3, (4)-4, (4)-5, (4)-6, (4)-7, (4)-8, (4)-9, (4)-10 and (4)-11

(4)-1

(4)-2

(4)-3

(4)-4

(4)-5
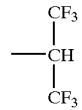

(4)-6
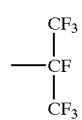

(4)-7

(4)-8

(4)-9

(4)-10
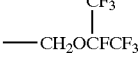

(4)-11

24. A polymer comprising recurring units of a compound of formula (1):

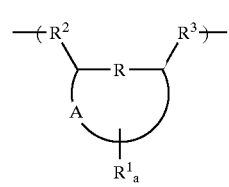

(1)

wherein A is a divalent aliphatic or alicyclic hydrocarbon group of 2 to 20 carbon atoms, $R^1$ is an alkyl group containing at least one fluorine atom, and which optionally contains a hetero atom, "a" is a positive number of 1 to 3, R is a single bond, ethylene group, oxygen atom, NH group or sulfur atom, and $R^2$ and $R^3$ each are a single bond or methylene group, said compound further comprising recurring units of a styrene compound of formula (6)

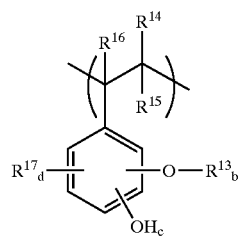

(6)

wherein $R^{13}$ is an acid labile group, $R^{14}$, $R^{15}$ and $R^{16}$ are, each independently, a hydrogen atom, fluorine atom, or a straight, branched or cyclic alkyl group of 1 to 10 carbon atoms, which are, each independently, optionally substituted with fluorine, $R^{17}$ is a hydrogen atom, fluorine atom, or a straight, branched or cyclic alkyl group of 1 to 10 carbon atoms, which is optionally substituted with fluorine, b is a positive number of 1 to 5, and c and d are, each independently, 0 or a positive number of 1 to 4.

25. A polymer comprising recurring units of a compound of formula (1):

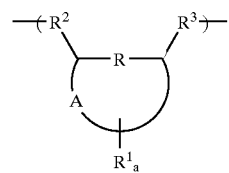

(1)

wherein A is a divalent aliphatic or alicyclic hydrocarbon group of 2 to 20 carbon atoms, $R^1$ is an alkyl group containing at least one fluorine atom, and which optionally contains a hetero atom, "a" is a positive number of 1 to 3, R is a single bond, ethylene group, oxygen atom, NH group or sulfur atom, and $R^2$ and $R^3$ each are a single bond or methylene group, said compound further comprising recurring units a norbornene compound selected from formulae (7)-1, (7)-2, (7)-3, (7)-4, (7)-5, (7)-6, and (7) 7

(7)-1
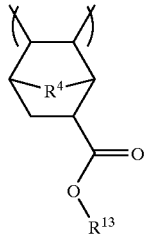

(7)-2
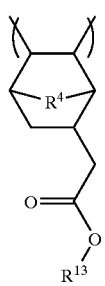

(7)-3
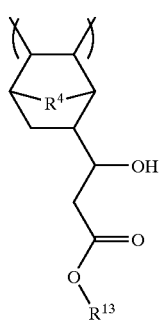

(7)-4
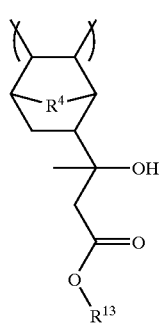

(7)-5
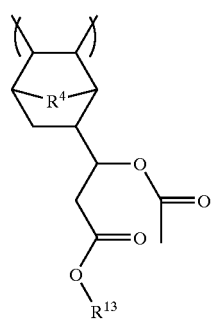

(7)-6
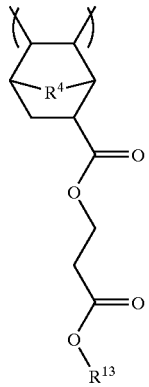

(7)-7
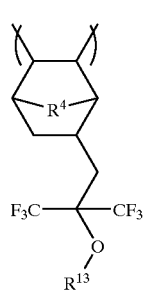

wherein $R^4$ is a methylene group, oxygen atom, NH group or sulfur atom, and $R^{13}$ is an acid labile group.

26. A polymer comprising recurring units of a compound of formula (1):

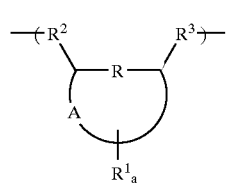

wherein A is a divalent aliphatic or alicyclic hydrocarbon group of 2 to 20 carbon atoms, $R^1$ is an alkyl group containing at least one fluorine atom, and which optionally contains a hetero atom, "a" is a positive number of 1 to 3, R is a single bond, ethylene group, oxygen atom, NH group or sulfur atom, and $R^2$ and $R^3$ each are a single bond or methylene group, said compound further comprising recurring units of tricyclodecene compound selected from formulae (8)-1, (8)-2, (8)-3, (8)-4, (8)-5, (8)-6, (8)-7, 98)-8, (8)-9, (8)-10, (8)-11, (8)-12, (8)-13, and (8)-14

(8)-1
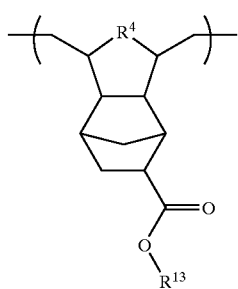
(8)-2
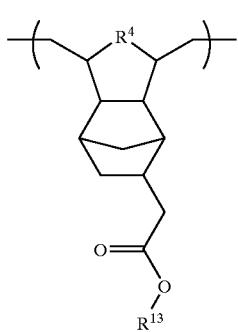
(8)-3
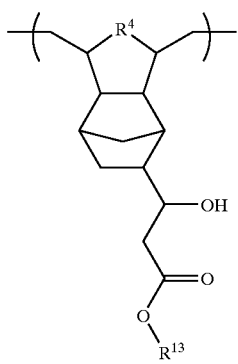
(8)-4
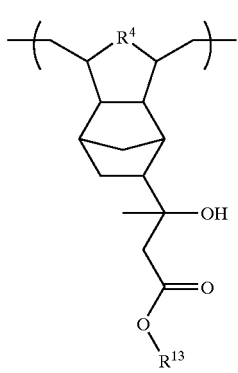
(8)-5
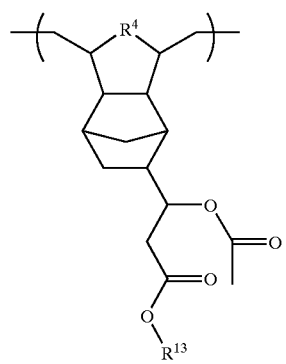
(8)-6
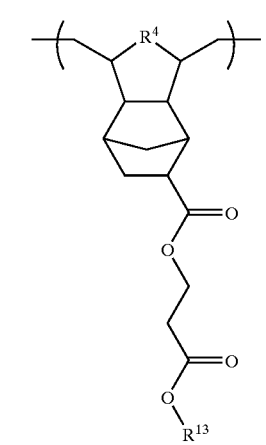
(8)-7
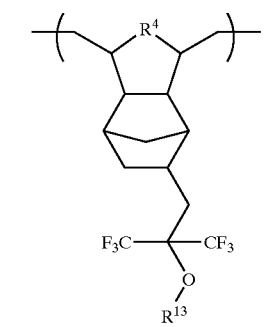
(8)-8
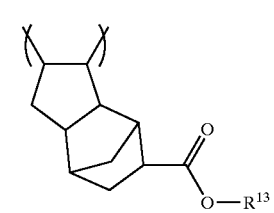
(8)-9
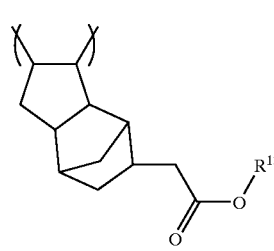

-continued (8)-10
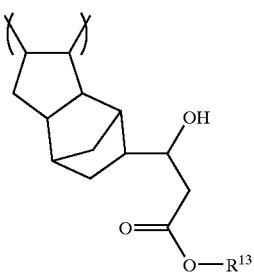

(8)-11
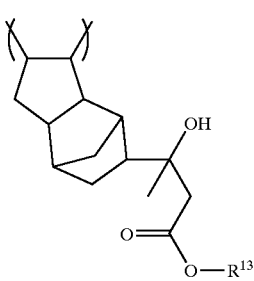

(8)-12
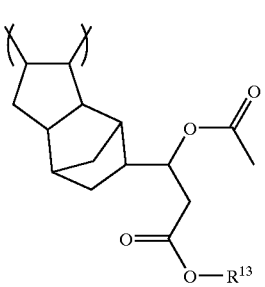

(8)-13
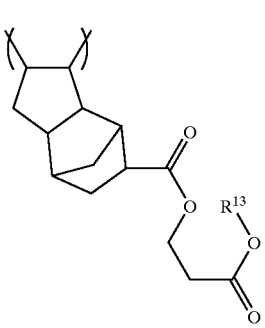

(8)-14
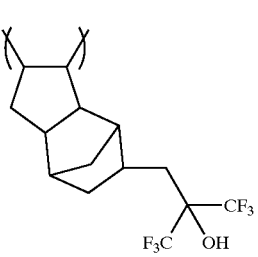

wherein $R^4$ is a methylene group, oxygen atom, NH group or sulfur atom, and $R^{13}$ is an acid labile group.

27. A polymer comprising recurring units of a compound of formula (1):

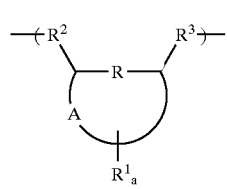
(1)

wherein A is a divalent aliphatic or alicyclic hydrocarbon group of 2 to 20 carbon atoms, $R^1$ is an alkyl group containing at least one fluorine atom, and which optionally contains a hetero atom, "a" is a positive number of 1 to 3, R is a single bond, ethylene group, oxygen atom, NH group or sulfur atom, and $R^2$ and $R^3$ each are a single bond or methylene group, said compound further comprising recurring units of a tetracyclododecene compound selected from formulae (9)-1, (9)-2, (9)-3, (9)-4, (9)-5, (9)-6, and (9)-7

(9)-1
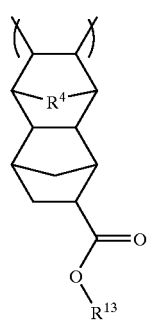

(9)-2
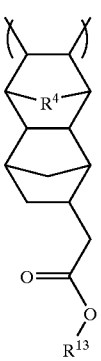

(9)-3
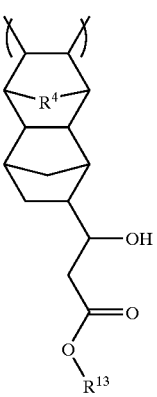

(9)-4

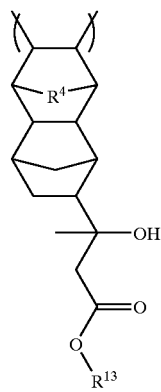

(9)-5

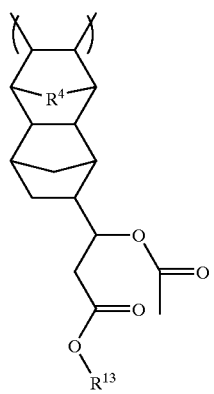

(9)-6

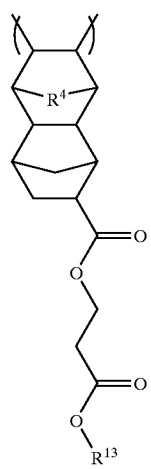

(9)-7

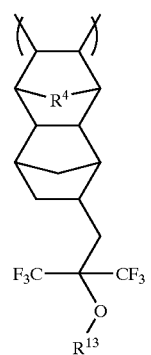

wherein $R^4$ is a methylene group, oxygen atom, NH group or sulfur atom, and $R^{13}$ is an acid labile group.

28. A polymer comprising recurring units of a compound of formula (1):

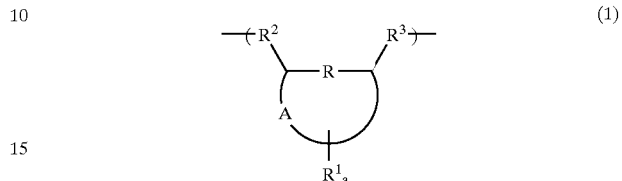

(1)

wherein A is a divalent aliphatic or alicyclic hydrocarbon group of 2 to 20 carbon atoms, $R^1$ is an alkyl group containing at least one fluorine atom, and which optionally contains a hetero atom, "a" is a positive number of 1 to 3, R is a single bond, ethylene group, oxygen atom, NH group or sulfur atom, and $R^2$ and $R^3$ each are a single bond or methylene group, said compound further comprising recurring units of maleimide compound of formula (10)-1 or (10)-2

(10)-1

(10)-2 wherein $R^{13}$ is an acid labile group, $R^{14}$ is a single bond or an alkylene group of 1 to 10 carbon atoms, and $R^{15}$ and $R^{16}$ are, each independently, hydrogen, fluorine, methyl or trifluoromethyl.

29. A polymer comprising recurring units of a compound of formula (1):

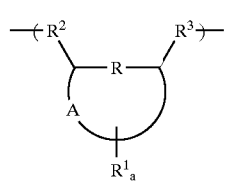

wherein A is a divalent aliphatic or alicyclic hydrocarbon group of 2 to 20 carbon atoms, $R^1$ is an alkyl group containing at least one fluorine atom, and which optionally contains a hetero atom, "a" is a positive number of 1 to 3, R is a single bond, methylene group, oxygen atom, NH group or sulfur atom, and $R^2$ and $R^3$ each are a single bond or methylene group, said compound further comprising recurring units of a vinyl alcohol compound of formula (11)

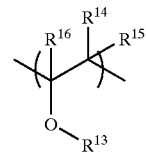

wherein $R^{13}$ is an acid labile group, and $R^{14}$, $R^{15}$ and $R^{16}$ are, each independently, a hydrogen atom, fluorine atom, or a straight, branched or cyclic alkyl group of 1 to 10 carbon atoms, which are, each independently, optionally substituted with fluorine.

* * * * *